United States Patent
Kotler et al.

(10) Patent No.: US 10,633,758 B2
(45) Date of Patent: Apr. 28, 2020

(54) PRINTING OF THREE-DIMENSIONAL METAL STRUCTURES WITH A SACRIFICIAL SUPPORT

(71) Applicant: ORBOTECH LTD., Yavne (IL)

(72) Inventors: Zvi Kotler, Tel Aviv (IL); Michael Zenou, Hashmonaim (IL)

(73) Assignee: ORBOTECH LTD., Yavne (IL)

( * ) Notice: Subject to any disclaimer, the term of this patent is extended or adjusted under 35 U.S.C. 154(b) by 217 days.

(21) Appl. No.: 15/537,885

(22) PCT Filed: Jan. 14, 2016

(86) PCT No.: PCT/IL2016/050037
§ 371 (c)(1),
(2) Date: Jun. 20, 2017

(87) PCT Pub. No.: WO2016/116924
PCT Pub. Date: Jul. 28, 2016

(65) Prior Publication Data
US 2017/0365484 A1    Dec. 21, 2017

Related U.S. Application Data (60) Provisional application No. 62/104,866, filed on Jan. 19, 2015.

(51) Int. Cl.
*C25F 3/02* (2006.01)
*C23C 14/04* (2006.01)
(Continued)

(52) U.S. Cl.
CPC .............. *C25F 3/02* (2013.01); *B22F 3/1055* (2013.01); *B22F 3/1103* (2013.01); *B22F 5/10* (2013.01);
(Continued)

(58) Field of Classification Search
CPC .... C25F 3/02–12; C25F 7/00; H01L 21/3063; B22F 3/1055; C23F 1/02
See application file for complete search history.

(56) References Cited

U.S. PATENT DOCUMENTS 3,963,852 A    6/1976   Baxter
4,752,455 A    6/1988   Mayer
(Continued)

FOREIGN PATENT DOCUMENTS

DE          10237732 A1    3/2004
DE       102012003866 B4    7/2013
(Continued)

OTHER PUBLICATIONS

Emeric et al., "Multi-jets formation using laser forward transfer", Applied Surface Science, vol. 302, pp. 153-158, year 2014.
(Continued)

*Primary Examiner* — Nicholas A Smith
(74) *Attorney, Agent, or Firm* — Kligler & Associates Patent Attorneys Ltd (57) ABSTRACT

A method for 3D printing includes printing a first metallic material on a substrate as a support structure (48). A second metallic material, which is less anodic than the first metallic material, is printed on the substrate as a target structure (46), in contact with the support structure. The support structure is chemically removed from the target structure by applying a galvanic effect to selectively corrode the first metallic material.

28 Claims, 5 Drawing Sheets

(51) Int. Cl.

| | | |
|---|---|---|
| C23C 26/02 | (2006.01) | |
| C23C 14/28 | (2006.01) | |
| B33Y 10/00 | (2015.01) | |
| B33Y 80/00 | (2015.01) | |
| B33Y 30/00 | (2015.01) | |
| C23C 26/00 | (2006.01) | |
| B22F 5/10 | (2006.01) | |
| B33Y 40/00 | (2020.01) | |
| B22F 3/11 | (2006.01) | |
| B22F 3/105 | (2006.01) | |
| C25F 7/00 | (2006.01) | |
| C25F 3/14 | (2006.01) | |
| C23C 14/30 | (2006.01) | |
| C25F 3/12 | (2006.01) | |
| H01L 21/3063 | (2006.01) | |
| H01L 21/428 | (2006.01) | |
| H01L 21/48 | (2006.01) | |

(52) U.S. Cl.
CPC .............. *B33Y 10/00* (2014.12); *B33Y 30/00* (2014.12); *B33Y 40/00* (2014.12); *B33Y 80/00* (2014.12); *C23C 14/048* (2013.01); *C23C 14/28* (2013.01); *C23C 14/30* (2013.01); *C23C 26/00* (2013.01); *C23C 26/02* (2013.01); *C25F 3/12* (2013.01); *C25F 3/14* (2013.01); *C25F 7/00* (2013.01); *H01L 21/3063* (2013.01); *H01L 21/428* (2013.01); *H01L 21/4867* (2013.01); *B22F 2003/1056* (2013.01); *B22F 2003/1058* (2013.01); *B22F 2005/103* (2013.01); *B22F 2999/00* (2013.01); *Y02P 10/295* (2015.11)

(56) References Cited

U.S. PATENT DOCUMENTS

| | | | |
|---|---|---|---|
| 4,891,183 | A | 1/1990 | Corwin |
| 4,895,735 | A | 1/1990 | Cook |
| 4,931,323 | A | 6/1990 | Manitt et al. |
| 4,970,196 | A | 11/1990 | Kim et al. |
| 4,977,038 | A * | 12/1990 | Sieradzki ........... B01D 67/0044 205/666 |
| 4,987,006 | A | 1/1991 | Williams et al. |
| 5,173,441 | A | 12/1992 | Yu et al. |
| 5,292,559 | A | 3/1994 | Joyce, Jr. et al. |
| 5,308,737 | A | 5/1994 | Bills et al. |
| 5,492,861 | A | 2/1996 | Opower |
| 5,683,601 | A | 11/1997 | Tatah |
| 5,725,914 | A | 3/1998 | Opower |
| 5,935,758 | A | 8/1999 | Patel et al. |
| 6,025,110 | A | 2/2000 | Nowak |
| 6,155,330 | A | 12/2000 | Kinane et al. |
| 6,159,832 | A | 12/2000 | Mayer |
| 6,177,151 | B1 | 1/2001 | Chrisey et al. |
| 6,261,493 | B1 | 1/2001 | Gaylo et al. |
| 6,348,295 | B1 | 2/2002 | Griffith et al. |
| 6,412,143 | B1 | 7/2002 | Chen |
| 6,440,503 | B1 | 8/2002 | Merdan et al. |
| 6,583,381 | B1 | 6/2003 | Duignan |
| 6,600,457 | B2 | 7/2003 | Heinz et al. |
| 6,649,861 | B2 | 11/2003 | Duignan |
| 6,792,326 | B1 | 9/2004 | Duignan et al. |
| 6,805,918 | B2 | 10/2004 | Auyeung et al. |
| 6,815,015 | B2 | 11/2004 | Young et al. |
| 6,822,189 | B2 | 11/2004 | Hong et al. |
| 6,899,988 | B2 | 5/2005 | Kidnie et al. |
| 6,921,626 | B2 | 7/2005 | Ray et al. |
| 7,236,334 | B2 | 6/2007 | Ding et al. |
| 7,277,770 | B2 | 10/2007 | Huang et al. |
| 7,294,449 | B1 | 11/2007 | Gudeman et al. |
| 7,358,169 | B2 | 4/2008 | Zhu et al. |
| 7,364,996 | B2 | 4/2008 | Kawase et al. |
| 7,423,286 | B2 | 9/2008 | Handy et al. |
| 7,534,544 | B2 | 5/2009 | Principe et al. |
| 7,608,308 | B2 | 10/2009 | Liu et al. |
| 7,784,173 | B2 | 8/2010 | Wolkin et al. |
| 7,799,699 | B2 | 9/2010 | Nuzzo et al. |
| 7,938,855 | B2 | 5/2011 | Gregorich et al. |
| 7,942,987 | B2 | 5/2011 | Crump et al. |
| 7,982,296 | B2 | 9/2011 | Nuzzo et al. |
| 8,025,542 | B2 | 9/2011 | Birrell et al. |
| 8,056,222 | B2 | 11/2011 | Pique et al. |
| 8,215,371 | B2 | 7/2012 | Batchelder et al. |
| 8,216,931 | B2 | 7/2012 | Zhang et al. |
| 8,221,822 | B2 | 7/2012 | Flanagan et al. |
| 8,262,916 | B1 | 9/2012 | Smalley et al. |
| 8,395,083 | B2 | 3/2013 | Naveh et al. |
| 8,420,978 | B2 | 4/2013 | Jain et al. |
| 8,440,546 | B2 | 5/2013 | Nuzzo et al. |
| 8,535,041 | B2 | 9/2013 | Slafer |
| 8,545,931 | B2 | 10/2013 | Szuch |
| 8,574,615 | B2 | 11/2013 | Tenney et al. |
| 8,729,524 | B2 | 5/2014 | Rogers et al. |
| 8,741,194 | B1 | 6/2014 | Ederer et al. |
| 8,743,165 | B2 | 6/2014 | Sandstriim |
| 9,027,378 | B2 | 5/2015 | Crump et al. |
| 9,029,058 | B2 | 5/2015 | Martin |
| 9,044,805 | B2 | 6/2015 | Prest et al. |
| 9,446,618 | B2 | 9/2016 | Batt et al. |
| 9,925,797 | B2 | 3/2018 | Kotler et al. |
| 2002/0085085 | A1 | 7/2002 | Fischer et al. |
| 2003/0006534 | A1 | 1/2003 | Taboas et al. |
| 2004/0069471 | A1 | 4/2004 | Corduan et al. |
| 2004/0233408 | A1 | 11/2004 | Sievers |
| 2004/0241585 | A1 | 12/2004 | Kato et al. |
| 2005/0056626 | A1 | 3/2005 | Gross et al. |
| 2005/0095367 | A1 | 5/2005 | Babiarz et al. |
| 2005/0112015 | A1 | 5/2005 | Bampton |
| 2005/0211163 | A1 | 9/2005 | Li et al. |
| 2005/0212888 | A1 | 9/2005 | Lehmann et al. |
| 2006/0076584 | A1 | 4/2006 | Kim et al. |
| 2007/0203584 | A1 | 8/2007 | Bdyopadhyay et al. |
| 2007/0274028 | A1 | 11/2007 | Hsu et al. |
| 2008/0006966 | A1 | 1/2008 | Mannella |
| 2008/0041725 | A1 | 2/2008 | Klein et al. |
| 2008/0233291 | A1 | 9/2008 | Chandrasekaran |
| 2008/0245968 | A1 | 10/2008 | Tredwell et al. |
| 2008/0286488 | A1 | 11/2008 | Li et al. |
| 2008/0314881 | A1 | 12/2008 | Ringeisen et al. |
| 2009/0074987 | A1 | 3/2009 | Auyeung et al. |
| 2009/0130427 | A1 | 5/2009 | Grigoropoulos et al. |
| 2009/0130467 | A1 | 5/2009 | Liu et al. |
| 2009/0217517 | A1 | 9/2009 | Pique et al. |
| 2010/0021638 | A1 | 1/2010 | Varanka et al. |
| 2010/0022078 | A1 | 1/2010 | Rockenberger et al. |
| 2010/0035375 | A1 | 2/2010 | Grigoropoulos et al. |
| 2010/0100635 | A1 | 9/2010 | Gold et al. |
| 2011/0003246 | A1 | 1/2011 | Kurok |
| 2011/0097550 | A1 | 4/2011 | Matusovsky et al. |
| 2011/0136162 | A1 | 6/2011 | Sun et al. |
| 2011/0188016 | A1 | 8/2011 | De Jager et al. |
| 2011/0278269 | A1 | 11/2011 | Gold et al. |
| 2012/0015112 | A1 | 1/2012 | Yang et al. |
| 2012/0025182 | A1 | 2/2012 | Umeda et al. |
| 2012/0080088 | A1 | 4/2012 | Grabitz et al. |
| 2012/0244321 | A1 | 9/2012 | Hsu et al. |
| 2012/0247740 | A1 | 10/2012 | Gertner et al. |
| 2013/0011562 | A1 | 1/2013 | Varanka et al. |
| 2013/0029480 | A1 | 1/2013 | Niklaus et al. |
| 2013/0037838 | A1 | 2/2013 | Speier et al. |
| 2013/0176699 | A1 | 7/2013 | Tonchev et al. |
| 2013/0302154 | A1 | 11/2013 | Finlayson |
| 2013/0313756 | A1 | 11/2013 | Chen et al. |
| 2013/0335504 | A1 | 12/2013 | Sandstrom et al. |
| 2014/0001675 | A1 | 1/2014 | Nakamura et al. |
| 2014/0097277 | A1 | 4/2014 | Kumta et al. |
| 2014/0160452 | A1 | 6/2014 | De Jager et al. |
| 2014/0231266 | A1 | 8/2014 | Sherrer et al. |
| 2014/0238574 | A1 | 8/2014 | Kinser et al. |
| 2015/0001093 | A1 * | 1/2015 | Carter ..................... B23H 9/14 205/640 |

(56) References Cited

U.S. PATENT DOCUMENTS

| | | |
|---|---|---|
| 2015/0024317 A1 | 1/2015 | Orrock et al. |
| 2015/0024319 A1 | 1/2015 | Martin |
| 2015/0086705 A1 | 3/2015 | Meinders et al. |
| 2015/0197063 A1 | 7/2015 | Shinar et al. |
| 2015/0197862 A1 | 7/2015 | Engel et al. |
| 2015/0203984 A1* | 7/2015 | Zhang .................. C25F 3/02 429/218.1 |
| 2015/0294872 A1 | 10/2015 | Molpeceres Alvarez et al. |
| 2015/0097316 A1 | 12/2015 | Desimone et al. |
| 2015/0382476 A1 | 12/2015 | Zenou et al. |
| 2016/0218287 A1 | 7/2016 | McAlpine et al. |
| 2016/0233089 A1 | 8/2016 | Zenou et al. |
| 2016/0336303 A1 | 11/2016 | Tsai |
| 2017/0021014 A1 | 1/2017 | Boger |
| 2017/0189995 A1 | 7/2017 | Zenou et al. |
| 2017/0210142 A1 | 7/2017 | Kotler et al. |
| 2017/0250294 A1 | 8/2017 | Zenou et al. |

FOREIGN PATENT DOCUMENTS

| | | | |
|---|---|---|---|
| EP | 1847632 A1 | 10/2007 | |
| EP | 2299784 A1 | 3/2011 | |
| EP | 2660352 A1 | 11/2013 | |
| EP | 3166143 A1 | 5/2017 | |
| GB | 2453774 A | 4/2009 | |
| JP | S61260603 A | 11/1986 | |
| JP | H04269801 A | 9/1992 | |
| JP | 0634283 A | 2/1994 | |
| JP | H0634283 A | 2/1994 | |
| JP | 11337227 A | 12/1999 | |
| JP | 3871096 B2 | 1/2007 | |
| JP | 2015144252 A | 8/2015 | |
| WO | 2003056320 A2 | 7/2003 | |
| WO | 2007134300 A2 | 11/2007 | |
| WO | 2009029119 A1 | 3/2009 | |
| WO | WO-2009062754 A1 * | 5/2009 | ............ C25D 5/022 |
| WO | 2009081355 A2 | 7/2009 | |
| WO | 2009153792 A2 | 12/2009 | |
| WO | 2010100635 A1 | 9/2010 | |
| WO | 2012066338 A2 | 5/2012 | |
| WO | 2013023874 A1 | 2/2013 | |
| WO | 2013037838 A1 | 3/2013 | |
| WO | 2013080030 A1 | 6/2013 | |
| WO | 2013124114 A1 | 8/2013 | |
| WO | 2013165241 A1 | 11/2013 | |
| WO | 2014061024 A1 | 4/2014 | |
| WO | 2015056253 A1 | 4/2015 | |
| WO | 2015155662 A1 | 10/2015 | |
| WO | 2015181810 A1 | 12/2015 | |
| WO | 2016063270 A1 | 4/2016 | |
| WO | 2016116921 A1 | 7/2016 | |
| WO | 2016124712 A2 | 8/2016 | |
| WO | 2017006306 A1 | 1/2017 | |
| WO | 2017085712 A | 5/2017 | |
| WO | 2017085712 A1 | 5/2017 | |

OTHER PUBLICATIONS

Fardel et al., Laser-Induced Forward Transfer of Organic LED Building Blocks Studied by Time-Resolved Shadowgraphy, The journal of Physical Chemistry, vol. 114, issue 12, pp. 5617-5636, year 2010.

Zhang., "Functional Material and Application Thereof", China Machine Press, 5 pages (relevant pp. 86-87), Jan. 2009 (only abstract is available in English).

European Application # 15852999 search report dated May 11, 2018.

European Application # 14853466 search report dated Jul. 7, 2018.

European Application # 14751180 search report dated Nov. 9, 2016.

Biver et al., "Multi-jets formation using laser forward transfer", Applied Surface Science , vol. 302 , pp. 153-158, May 30, 2014.

Pique et al., "Laser Direct-Write of Embedded Electronic Components and Circuits", In Photon processing in Microelectronics and Photonics IV, vol. 5713, pp. 223-231, Apr. 1, 2005.

Barnett et al., "Integrating Electronics", 7 pages, Feb. 4, 2017.

International Application # PCT/IL2018/050455 search report dated Jul. 30, 2018.

Pique et al., "Laser Forward Transfer of Electronic and Power Generating Materials", Laser Ablation and its Applications, Chapter 14, pp. 339-373, Dec. 31, 2007.

Young et al., "Dielectric properties of oxide structures by a laser-based direct-writing method", Journal of Materials Research, vol. 16, No., pp. 1720-1725, Jun. 30, 2001.

Nagel et al., "Laser-Induced Forward Transfer for the Fabrication of Devices", Nanomaterials: Processing and Characterization with Lasers, First Edition, pp. 255-316, year 2012.

Papavlu et al.,"Laser Induced Forward Transfer for Materials Patterning", Romanian Reports in Physics, vol. 63, supplement, pp. 1285-1301, year 2011.

Zergioti et al., "Microdeposition of metals by femtosecond excimer lase", Applied Surface Science, vols. 127-129, pp. 601-605, year 1998.

Vispute et al., "Reactive deposition of YIBa2Cu30 7-x superconductor films by pulsed laser ablation from an unreacted mixture of Y2O3, BaCO 3 and CuO", Bulletin of Materials Science, vol. 15, No. 4, pp. 377-384, Aug. 1992.

Hecht.,"Multifrequency Acoustooptic Diffraction," IEEE Transactions on Sonics and Ultrasonics, vol. SU-24, No. 1, pp. 7-18, year 1977.

Trypogeorgos et al., "Precise shaping of laser light by an acousto-optic deflector", Optics Express, vol. 21, No. 21, pp. 24837-24846, Oct. 21, 2013.

Tan et al., "Selective surface texturing using femtosecond pulsed laser induced forward transfer", Applied Surface Scienc, vol. 207, pp. 365-371, year 2003.

Adrian et al., "A study of the mechanism of metal deposition by the laser-induced forward transfer process", Journal of Vacuum Science and Technology B, vol. 5, No. 5, pp. 1490-1494, Sep./Oct. 1987.

Baseman.,"Formation of Metal Silicon Alloys by Laser Induced Forward Transfer", An IP.com Prior Art Database Technical Disclosure, 2 pages, Jul. 1, 1988.

Gehner., "MEMS Adaptive Optics Development at IPMS", Fraunhofer, Feb. 15, 2007.

Kumpulainen et al., "Low Temperature Nanoparticle Sintering with Continuous Wave and Pulse Lasers", Optics & Laser Technology 43 , pp. 570-576, year 2011.

Theodorakos et al., "Selective Laser Sintering of Ag Nanoparticles Ink for Applications in Flexible Electronics", Applied Surface Science 336 , pp. 157-162, 2015.

Wang et al., "Silicon solar cells based on all-laser-transferred contacts", Progress in Photovoltaics: Research and Applications, 23 , pp. 61-68 Jul. 19, 2013.

Willis et al., "Microdroplet deposition by laser-induced forward transfer", Applied Physics Letters, vol. 86, pp. 244103-1-244103-3, year 2005.

Antonov., "Angular Splitting of the Bragg Diffraction Order in an Acoustooptical Modulator Due to a Frequency-Modulated Acoustic Wave", Technical Physics, vol. 50, No. 4, pp. 513-516, year 2005.

Banks et al., "Nanodroplets deposited in microarrays by femtosecond Ti:sapphire laser-induced forward transfer", Applied Physics Letters, vol. 89, pp. 193107-1-193107-3, year 2006.

Antonov., "Acoustooptic Nonpolar Light Controlling Devices and Polarization Modulators Based on Paratellurite crystals", Technical Physics, vol. 49, No. 10, pp. 1329-1334, year 2004.

Antonov et al., "Improving the Efficiency of an Acoustooptic Modulator with a Two-Lobe Directivity Pattern by Correcting the Two-Frequency Electric Signal", ISSN 1063-7842, Technical Physics, vol. 51, No. 1, pp. 57-62, year 2006.

Antonov et al., "Inverse Acoustooptic Problem: Coherent Summing of Optical Beams into a Single Optical Channel", ISSN 1063-7842, Technical Physics, vol. 52, No. 5, pp. 610-615, year 2007.

Antonov et al., "Efficient Multiple-Beam Bragg Acoustooptic Diffraction with Phase Optimization of a Multifrequency Acoustic Wave", ISSN 1063-7842, Technical Physics, vol. 52, No. 8, pp. 1053-1060, year 2007.

(56) References Cited

OTHER PUBLICATIONS

Antonov et al., "Formation of the Multibeam Pattern of the Bragg Diffraction of Light by a Periodically Phase Modulated Acoustic Signal", ISSN 1064-2269, Journal of Communications Technology and Electronics, vol. 53, No. 4, pp. 453-459, year 2008.
Antonov et al., "Highly Effective Acoustooptic Diffraction of Light by Multifrequency Sound Using a Nonaxial Deflector", ISSN 1063-7842, Technical Physics, vol. 53, No. 6, pp. 752-756, year 2008.
Antonov et al., "Switch multiplexer of fiber-optic channels based on multibeam acousto-optic diffraction", Applied optics, vol. 48, No. 7, pp. C171-C181, Mar. 1, 2009.
Zenou et al., "Laser Transfer of Metals and Metal Alloys for Digital Microfabrication of 3D Objects", SMALL, vol. 11, issue 33, pp. 4082-4089, Sep. 2, 2015.
Zenou et al., "Solar cell metallization by laser transfer of metal micro-droplets", ScienceDirect, Energy Procedia, vol. 67, pp. 147-155, year 2015.
Bera et al., "Optimization study of the femtosecond laser-induced forward-transfer process with thin aluminum films", Applied Optics, vol. 46, No. 21, pp. 4650-4659, Jul. 20, 2007.
Li et al., "Microdroplet deposition of copper film by femtosecond laser-induced forward transfer", Applied Physics Letters, vol. 89, pp. 161110-4-161110-4, year 2006.
Roder et al., "Low Temperature Laser Metallization for Silicon Solar Cells", ScienceDirect, Energy Procedia, vol. 8, pp. 552-557, year 2011.
Tien et al., "Precision laser metallization", Microelectronic Engineering, vol. 56, pp. 273-279, year 2001.
Fraunhofer IPMS, Spatial Light Modulators (SLM), 2 pages, Jun. 7, 2016.
Fraunhofer IPMS, "Micro Mirror Arrays (MMA) from DUV to NIR", 2 pages, Jun. 7, 2016.
Gehner et al., "Mems AO Micro Mirror Development at IPMS", Status and Perspectives, Fraunhofer IPMS, 30 pages, May 4, 2016.
BWT Beijing, "K915FG2RN-150.0W, 915nm 150W High Power Fiber Coupled Diode Laser", 4 pages, Jul. 1, 2016.
Zenou et al., "Digital laser printing of aluminum microstructure on thermally sensitive substrates", Journal of Physics D: Applied Physics 48, 205303 12 pages, 2015.
Willis et al., "The effect of melting-induced volumetric expansion on initiation of laser-induced forward transfer", Applied Surface Science 253, pp. 4759-4763, 2007.
Schultze et al., "Laser-induced forward transfer of aluminium", Applied Surface Science 52, pp. 303-309, 1991.
Pique, A., "Laser Transfer Techniques for Digital Microfabrication", vol. 135 of the series Springer Series in Materials Science, Chapter 11, pp. 259-291, Jun. 30, 2010.
Bohandy et al., "Metal deposition from a supported metal film using an excimer laser", Journal of Applied Physics, vol. 60, No. 4, pp. 1538-1539, Aug. 15, 1986.
U.S. Appl. No. 15/326,498 office action dated Jul. 12, 2017.
Komorita et al., "Oxidation state control of micro metal oxide patterns produced by using laser-induced forward transfer technique", Proceedings of 3rd International Symposium on Laser Precision Microfabrication, vol. 4830, pp. 20-24, Feb. 19, 2003.
Pique, "A novel laser transfer process for direct writing of electronic and sensor materials", Applied Physics A, issue 69, No. 7, pp. S279-S284, year 1999.
U.S. Appl. No. 15/313,569 office action dated Feb. 26, 2019.
JP Application # 2016-568049 office action dated Apr. 2, 2019.
Baseman et al., "Laser Induced Forward Transfer", Materials research society symposium proceedings, vol. 101, pp. 237-242, year 1988.
Toth et al., "Laser-induced compound formation and transfer of stacked elemental layers", Thin Solid Films, vol. 245, issues 1-2, pp. 40-43, Jun. 1, 1994.
European Application # 16739878 search report dated Jan. 2, 2018.
Vaezi et al., "A review on 3D micro-additive manufacturing technologies", The International Journal of Advanced Manufacturing Technology, vol. 67, issue 5-8, pp. 1721-1754, Jul. 2013.
Pique, A., "Rapid Prototyping of Embedded Microelectronics by Laser Direct-Write", Rapid Prototyping Technology—Principles and Functional Requirements, Chapter 12, pp. 247-272, Sep. 2011.
International Application PCT/IL2016/051180 Search Report dated Jan. 29, 2017.
Janikowski et al., "Noncyanide Stripper Placement Program", Department of the Air Force, Air force Engineering & Services Center, Engineering & Services Laboratory, pp. 110-114, May 1989.
Chinese Patent Application No. 201680005719.1 office action dated Aug. 14, 2019.
U.S. Appl. No. 15/763,451 Office action dated Oct. 30, 2019.

\* cited by examiner

PRINTING OF THREE-DIMENSIONAL METAL STRUCTURES WITH A SACRIFICIAL SUPPORT

CROSS-REFERENCE TO RELATED APPLICATION

This application claims the benefit of U.S. Provisional Patent Application 62/104,866, filed Jan. 19, 2015, which is incorporated herein by reference.

FIELD OF THE INVENTION

The present invention relates generally to printing of three-dimensional (3D) structures, and particularly to methods and systems for fabrication of structures with complex 3D topologies.

BACKGROUND

In laser direct-write (LDW) techniques, a laser beam is used to create a patterned surface with spatially-resolved 3D structures by controlled material ablation or deposition. Laser-induced forward transfer (LIFT) is an LDW technique that can be applied in depositing micro-patterns on a surface.

In LIFT, laser photons provide the driving force to catapult a small volume of material from a donor film toward an acceptor substrate. Typically, the laser beam interacts with the inner side of the donor film, which is coated onto a non-absorbing carrier substrate. The incident laser beam, in other words, propagates through the transparent carrier before the photons are absorbed by the inner surface of the film. Above a certain energy threshold, material is ejected from the donor film toward the surface of the substrate, which is generally placed, in LIFT systems that are known in the art, either in close proximity to or even in contact with the donor film. The applied laser energy can be varied in order to control the thrust of forward propulsion that is generated within the irradiated film volume. Nagel and Lippert provide a useful survey of the principles and applications of LIFT in micro-fabrication in "Laser-Induced Forward Transfer for the Fabrication of Devices," published in *Nanomaterials: Processing and Characterization with Lasers*, Singh et al., eds. (Wiley-VCH Verlag GmbH & Co. KGaA, 2012), pages 255-316.

LIFT techniques using metal donor films have been developed for a variety of applications, such as repair of electrical circuits. For example, PCT International Publication WO 2010/100635, whose disclosure is incorporated herein by reference, describes a system and method of repairing electrical circuits in which a laser is used to pre-treat a conductor repair area of a conductor formed on a circuit substrate. The laser beam is applied to a donor substrate in a manner that causes a portion of the donor substrate to be detached therefrom and to be transferred to a predetermined conductor location.

As another example, PCT International Publication WO 2015/056253 (published after the priority date of the present patent application), whose disclosure is incorporated herein by reference, describes a method for material deposition in which a transparent donor substrate has opposing first and second surfaces and multiple donor films including different, respective materials on the second surface. The donor substrate is positioned in proximity to an acceptor substrate, with the second surface facing toward the acceptor substrate. Pulses of laser radiation are directed to pass through the first surface of the donor substrate and impinge on the donor films so as to induce ejection of molten droplets containing a bulk mixture of the different materials from the donor films onto the acceptor substrate. Further details of this sort of LIFT technique are described in PCT International Publication WO 2015/181810 (also published after the priority date of the present patent application), whose disclosure is likewise incorporated herein by reference.

Some 3D fabrication techniques use sacrificial supports in creating a desired structure. For example, U.S. Patent Application Publication 2015/0197862 describes an additive metal deposition process in which a build piece is made from a build plan created from a three-dimensional definition of a desired part. The build plan has a first set of dimensions corresponding to the desired part and includes a support structure. The build piece is to a chemical etchant such that the support structure is removed from the build piece and the dimensions of the build piece corresponding to the desired part are reduced to a second set of dimensions.

SUMMARY

Embodiments of the present invention that are described hereinbelow provide improved methods and apparatus for printing of three-dimensional (3D) structures.

There is therefore provided, in accordance with an embodiment of the invention, a method for 3D printing, which includes printing a first metallic material on a substrate as a support structure, and printing a second metallic material, which is less anodic than the first metallic material, on the substrate as a target structure, in contact with the support structure. The support structure is chemically removed from the target structure by applying a galvanic effect to selectively corrode the first metallic material.

In some embodiments, one of the first and second materials includes a pure metal, and the other of the first and second materials includes an alloy of the pure metal. Typically, the pure metal makes up at least 90% of the alloy. Either the first material is the pure metal, and the second material is the alloy; or the second material is the pure metal, and the first material is the alloy; or the first and second materials are different alloys of the pure metal.

In some embodiments, printing the first and second metallic materials includes directing pulses of laser radiation onto first and second thin films, respectively, so as to induce laser-induced forward transfer (LIFT) of molten droplets of the first and second materials onto the substrate. In a disclosed embodiment, at least one of the first and second metallic materials includes a mixture of at least two component materials, and directing the pulses of laser radiation includes providing a transparent donor substrate on which multiple thin film layers are overlaid, including respective layers of each of the component materials, and irradiating the donor substrate with the pulses of laser radiation in order to induce ejection of molten droplets in which the component materials are mixed together.

In one embodiment, the method includes printing a third material over at least one of the first and second metallic materials, whereby the target structure includes, after removing the support structure, the second metallic material and the third material. For example, the third material may include a dielectric material.

In other embodiments, the second metallic material is printed over the first metallic material so that the target structure has a cavity containing the first metallic material, and chemically removing the support structure includes etching the first metallic material out of the cavity by the galvanic effect. In one embodiment, the method includes printing cathodic etch-assist structures, which are less anodic than the first metallic material, embedded within the first metallic material in the cavity so as to promote the galvanic effect during the etching, and the method includes removing the etch-assist structures from the cavity after etching out the first metallic material.

In further embodiments, printing the first and second metallic materials includes printing interspersed particles of the first and second metallic materials, and chemically removing the support structure includes etching away the particles of the second metallic material by the galvanic effect so that the target structure remaining after removal of the support structure is porous. In one embodiment, printing the interspersed particles includes varying a relative density of the particles of the first metallic material over an area of the target structure, so that the second metallic material remaining after removal of the support structure has a porosity that varies over the area of the target structure.

There is also provided, in accordance with an embodiment of the invention, fabrication apparatus, including a printing station, which is configured to print a first metallic material on a substrate as a support structure, and to print a second metallic material, which is less anodic than the first metallic material, on the substrate as a target structure, in contact with the support structure. An etching station is configured to chemically remove the support structure from the target structure by applying a galvanic effect to selectively corrode the first metallic material.

The present invention will be more fully understood from the following detailed description of the embodiments thereof, taken together with the drawings in which:

DETAILED DESCRIPTION OF EMBODIMENTS

Overview

Printing of 3D structures with complex topologies often entails the use of a sacrificial material. For example, when the target structure, made of a certain primary material, is to contain a concavity, such as a cavity or undercut, a sacrificial material is first printed in the locus of the concavity, and the primary material is printed over it. The sacrificial material is then removed by physical and/or chemical means. The processes of printing and removal of such sacrificial materials are often complex and costly, and the choices of materials available for such processes can be limiting.

Embodiments of the present invention that are described herein provide improved techniques for 3D printing of metallic structures. These techniques can be used to print 3D structures with high resolution, in a wide range of shapes, materials and physical properties. In the disclosed embodiments, a sacrificial metallic material is printed on a substrate as a support structure, and a primary metallic material is printed on the substrate as a target structure, in contact with the support structure. The sacrificial metallic material is chosen to have a lower electrode potential (lower electronegativity, meaning that the sacrificial material is more anodic) than the primary metallic material. Consequently, after printing the target structure, the support structure can be removed chemically by means of the galvanic effect, which selectively corrodes the sacrificial metallic material. This process step is referred to herein as galvanic corrosion or, equivalently, galvanic etching.

The galvanic effect has been known for centuries, but is generally regarded as undesirable, causing corrosion that can be catastrophic when different metals come in contact with an electrolyte. When two metals are brought into contact with one another, a voltage develops between the metals, which depends on their relative levels of electronegativity (also referred to as their anodic indexes). This voltage drives a current to flow between the two metals. When the metals are immersed in a conducting solution, an effective electrical circuit forms, which drives a corrosive galvanic effect. This process causes the more anodic metal, i.e., the less noble metal with a lower level of electronegativity, to be consumed and corroded, while the cathodic metal is largely unaffected. The process can take place without any external driving potential provided there is a proper medium (such as a solution or vapor) to carry the current and close the circuit.

In the disclosed embodiments, as described further hereinbelow, the primary and sacrificial metals can be printed using the same printing technique, such as LIFT, possibly even together in the same process step. The use of LIFT in this manner makes it possible to produce both the target and support structures efficiently with high precision. LIFT printing can be used in this context to print materials that are mixtures of component materials, such as alloys of component metals. LIFT techniques that can be used in this printing stage are described, for example, in the above-mentioned PCT International Publication WO 2015/056253. Additional materials can be printed, as well, to remain as parts of the target structure after galvanic etching, including not only additional metallic materials, but also non-metallic materials, such as dielectrics.

Although the embodiments described below are based specifically on LIFT printing, the principles of the present invention can alternatively be implemented, mutatis mutandis, using other suitable 3D printing techniques that are known in the art, such as molten metal jetting. The use of such alternative printing techniques in the present context is also considered to be within the scope of the present invention.

Typically, the process of removal of the support structure by galvanic etching is carried out by immersing the complete printed 3D structure in a conducting liquid solution. Increasing the concentration of the solution can accelerate the corrosion rate. Other factors that can be used to drive the bi-metallic corrosive reaction faster, including tuning the electrolyte composition, pH and electrical conductivity. In aqueous solutions involving oxygen reduction, aeration and oxygen supply can be enhanced, as well, to increase the corrosion rate.

In such corrosive galvanic processes, the rate and selectivity also depend on the surface area ratio between the primary and sacrificial materials. For example if the primary material has a much larger surface area then the sacrificial, then the etching rate will be accelerated. Alternatively, in some embodiments of the present invention, when the sacrificial material part has a larger surface area than the primary material, etch-assist structures, made of more cathodic material, can be printed in electrical contact with the support structure in order to drive faster corrosion. Further alternatively or additionally, a controlled, external potential bias can be applied to accelerate the galvanic effect.

In some embodiments of the present invention, the primary and sacrificial metallic materials are very similar in composition. For example, one of the materials (which can be either the primary or the sacrificial material) can be a pure metal, while the other comprises an alloy of the pure metal. The alloy is chosen to given the desired difference in electronegativity between the primary and sacrificial materials. Alternatively, both the primary and sacrificial materials can be alloys, for example, alloys of the same pure metal with small amounts of different components, which give the desired electronegativity difference.

Only small differences in composition between the primary and sacrificial materials are typically needed in order for the desired galvanic corrosion to occur. Typically, the pure metal can make up at least 90% of the alloy, and in many cases even more than 95% of the alloy. The use of such similar materials simplifies the printing process, since both the pure metal and the alloy will have similar physical properties, which in turn determine the printing properties. Such physical properties include, for example, thermal properties (such as melting temp, heat conduction, heat capacity), wetting properties (on the printed structure), surface tension (as liquefied metal), and mechanical properties (such as hardness).

System Description

Figure 1:
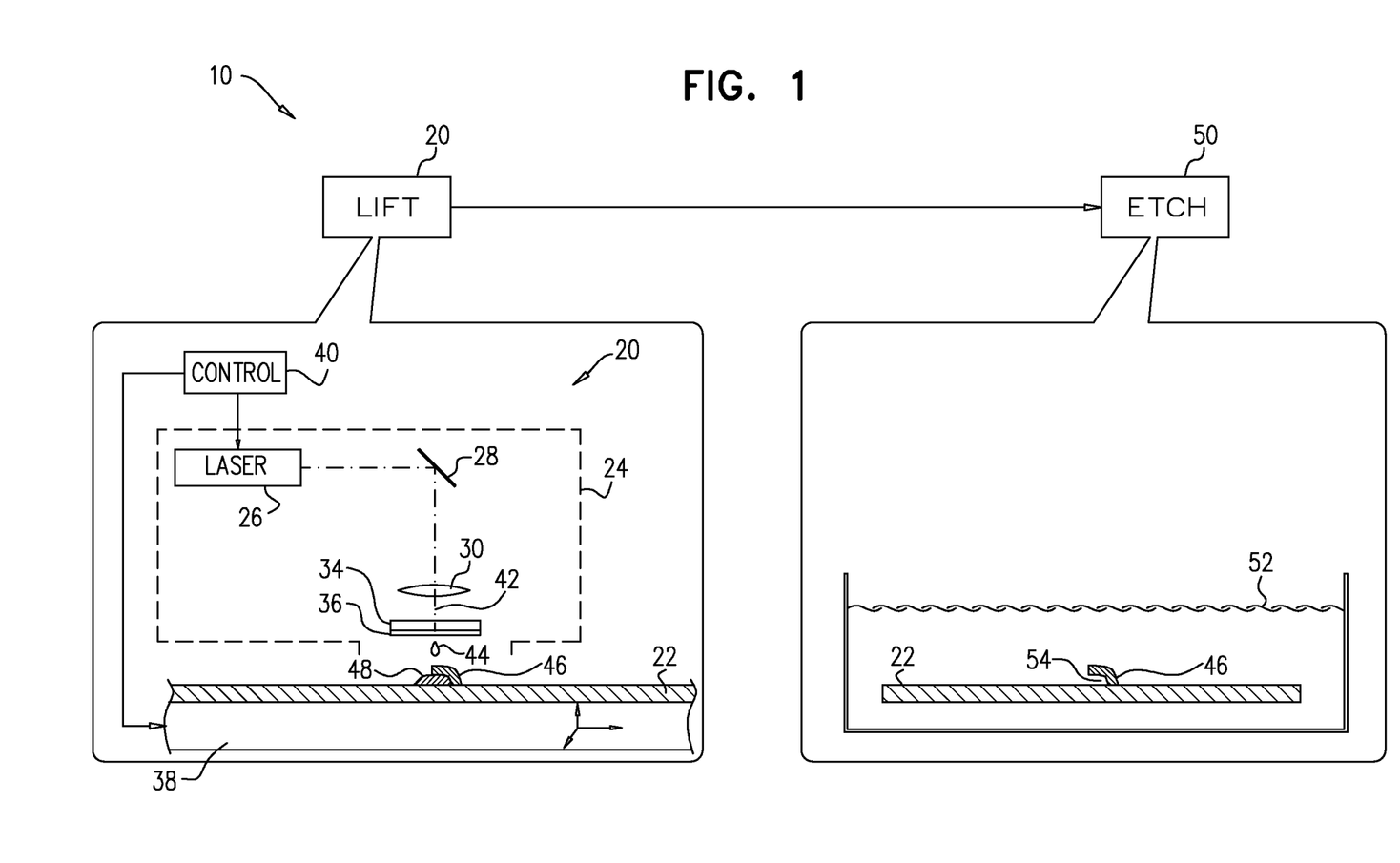
FIG. 1 is schematic side view and block diagram of a system for 3D printing, in accordance with an embodiment of the present invention.

FIG. 1 is a block diagram and side view of a system 10 for 3D printing, in accordance with an embodiment of the invention. System 10 comprises a LIFT station 20, which prints a target structure 46 in contact with a support structure 48, made from two different metallic materials, on an acceptor substrate 22. An etch station 50 chemically removes support structure 48 from target structure 46 by applying a galvanic effect to selectively corrode the metallic material of the support structure.

LIFT station 20 comprises an optical assembly 24, in which a laser 26 emits pulsed radiation, which is focused by suitable optics 30 onto a LIFT donor sheet 32. Donor sheet 32 comprises a transparent donor substrate 34 having at least one donor film 36 deposited thereon. A positioning assembly 38 positions donor substrate 34 and/or acceptor substrate 22 so that the donor substrate is in proximity to the upper surface of the acceptor substrate, with donor film 36 facing toward the acceptor substrate and a small gap in between (typically no more than a few hundred microns, and possibly less). Although positioning assembly 38 is shown in FIG. 1, for the sake of simplicity, as a basic X-Y-Z stage below acceptor substrate 22, in practice the positioning assembly in LIFT station 20 additionally or alternatively may be capable of positioning donor substrate 34 and/or elements of optical assembly 24, as will be apparent to those skilled in the art.

Donor substrate 34 typically comprises a glass or plastic sheet or other suitable transparent material, while donor films 36 comprise suitable donor materials, such as one or more pure metals and/or metal alloys. Typically, the thickness of the donor films is no more than a few microns. The structure and composition of donor films 36 are described further hereinbelow with reference to FIG. 2. In some applications of the techniques described herein, the donor films may additionally comprise one or more dielectric materials, as well as semiconductor and/or rheological materials, or combinations of such materials.

Optics 30 focus a beam 42 from laser 26 to pass through the outer surface of donor substrate 34 and to impinge on donor film 36, thereby causing droplets 44 of a fluid to be ejected from donor film 36 and fly across the gap to land on acceptor substrate 22. The fluid comprises a molten form of the material in donor film 36, which then hardens on the acceptor surface to form solid pieces having a shape defined by the printing pattern, such as target structure 46 and support structure 48. A scanner 28, such as a rotating mirror and/or an acousto-optic beam deflector under control of a control unit 40, scans laser beam 42 so as to irradiate different spots on donor films 36 and thus create structures of the desired shapes in the appropriate locations on acceptor substrate 22.

Laser 26 comprises, for example, a pulsed Nd:YAG laser with frequency-doubled output, which permits the pulse amplitude to be controlled conveniently by control unit 40. Typically, control unit 40 comprises a general-purpose computer, with suitable interfaces for controlling and receiving feedback from optical assembly 24, motion assembly 38, and other elements of LIFT station 20. The inventors have found that for good LIFT deposition results, the optimal pulse duration is in the range of 0.1 ns to 1 ns, but longer or shorter pulses may be used, depending on application requirements. Optics 30 are similarly controllable in order to adjust the size of the focal spot formed by the laser beam on donor film 36.

The size of droplets 44 is determined, inter alia, by the laser pulse energy, duration, and focal spot size and the thickness of the donor film. The above-mentioned PCT International Publication 2015/181810 describes LIFT techniques and parameters that can be applied so that each laser pulse causes a single, relatively large droplet to be ejected from the donor film. These techniques and parameters can be applied advantageously in LIFT station 20, since the droplets are ejected toward acceptor substrate 22 with accurate directionality, making it possible to hold donor film 36 at a distance of at least 100 μm from the acceptor substrate during ejection of the droplets and to create the desired structures with precision.

In the disclosed embodiments, LIFT station 20 causes droplets 44 of two or more different fluids, having different compositions, to be ejected from different donor films 36. Typically, the different fluids are ejected by directing beam 42 from laser 26 to impinge on different areas of donor films 36 (either on the same donor substrate 34 or different donor substrates) containing different materials. The different fluids may be ejected sequentially toward the same location on acceptor substrate 22 and/or toward different locations, in order to print the desired support and target structures. The ability to mix materials in this manner, in substantially any desired pattern and gradation, is a marked advantage of the present technique in comparison with methods of fabrication that are known in the art.

As noted earlier, control unit 40 controls scanner 28 and other elements of optical assembly 24 so as to write donor material from films 36 to the appropriate locations on acceptor substrate 22 and to make multiple passes, as needed, in order to build up the deposited volume of the donor material to the desired thickness. For example, LIFT station 20 may operate in this manner to produce solid pieces with various 3D shapes with one or more dimensions (height, width, and thickness) that are less than 1 mm. At least one of these dimensions may be less than 100 μm, and in some cases less than 10 μm, thus creating miniature (or even microscopic) pieces of precise shape. Alternatively, LIFT station 20 may be operated to print structures of substantially greater size. Multiple, interleaved layers of the primary material and the sacrificial material may be printed in this manner in successive passes over the desired locations, using the primary and sacrificial donor films in turn.

In etch station 50, substrate 22, on which target structure 46 and support structure 48 have been formed in LIFT station 20, is immersed in a bath containing a suitable electrolytic solvent 52. As explained above, the contact between the primary metallic material in target structure 46 and the sacrificial material in support structure 48, which is more anodic than the primary metallic material, causes galvanic corrosion in solvent 52 of support structure 48, while leaving target structure 46 substantially intact. Consequently, the support structure is chemically removed by station 50, leaving a cavity 54 in its place. Target structure 46 is then ready for further processing.

Although target structure 46 and cavity 54 are, for the sake of illustration, shown in the figures as topologically simple shapes, more complex structures can similarly be produced in system 10. When the structures are to have internal cavities, the target and support structures printed by LIFT station 20 are designed to leave continuous routes for solvent 52 to reach the locations at which the corrosive galvanic action is planned in order to remove the support structure. Additional etch-assist structures may also be printed, as illustrated below in FIGS. 4A-C.

Primary and Sacrificial Materials

As explained above, for ease and reliability of fabrication, it is desirable (although not essential) that the sacrificial material from which support structure 48 is printed be a metal or a metallic alloy having a composition similar to the primary material used to print target structure 46. The sacrificial material can be made more anodic, for example, by alloying the primary metal with a more anodic metal, thus providing the required difference in the electrical potential in order to drive the corrosive process in the required direction in etch station 50. Alternatively, the primary material can be an alloy that is made more cathodic relative to the sacrificial material. In either case, the primary material is typically chosen to give certain desired material properties (such as high electrical conductivity or high tensile strength) in the target structure. A sacrificial material is then chosen that is more anodic than the primary material while desirably sharing similar thermal and other physical properties with the primary material. For this reason, a pure metal and an alloy of the same metal often make a good combination, or possibly two different alloys of the same pure metal.

As an example of the first type of combination (pure metal primary material and sacrificial alloy), in order to print a copper 3D target structure, pure copper metal can be used as the primary material, and a Cu/Al alloy can serve as the more anodic sacrificial material. Only a low percentage of aluminum is needed to drive the galvanic corrosive reaction in the right direction, typically less than 10%, and possibly even less than 5%. Other alloys, such as Cu/Mg, can be used to similar effect. If the support structure has a substantially larger surface area than the target structure, however, it may be desirable to increase the difference in electronegativity between the primary and sacrificial materials, possibly by increasing the aluminum concentration, for example. Solvent 52 in this case could comprise, for instance, copper chloride in aqueous hydrochloric acid solution or ferric chloride solution.

As an alternative example of the second type mentioned above, copper metal can be used as the sacrificial material, and a Cu/Ag alloy as the primary, more cathodic structural material. This choice will result in a 3D structure made of Cu/Ag. Again a very low percentage of silver is typically needed to drive the reaction in etch station 50. Alternatively, gold or palladium could be alloyed with the copper to produce the primary material.

As other alternatives, both the primary and sacrificial materials can be alloys, or both can be pure metals, so long as the appropriate difference of electronegativity is achieved.

Table I below shows some additional examples of combinations of primary and sacrificial materials, along with suitable solvents. Other combinations will be apparent to those skilled in the art after reading the present description and are considered to be within the scope of the present invention.

TABLE I

EXAMPLE PRINT MATERIALS AND SOLVENTS

| | Primary material | Sacrificial material | Solution |
|---|---|---|---|
| | | Copper-based structures | |
| 1 | Pure copper | Cu98%/Al2% (Aluminum Bronze) | Ferric chloride |
| 2 | Cu97%/Ag3% | Cu | -"- |
| 3 | Cu97%/Ag3% | Cu98%/Al2% | -"- |
| | | Aluminum-based structures | |
| 1 | Al | Al/Zn; Al/Mg | $HNO_3$ (Al oxidation); $H_3PO_4$ ($Al_2O_3$ diss.), buffered water solution, Keller's Etch: Distilled water; Nitric acid Hydrochloric acid Hydrofluoric acid |
| | | Titanium | |
| | Ti | Ti/Al; Ti/Ni | HF; oxalic acid; concentrated acids (HCl and $H_2SO_4$) at ~100° C. |

TABLE I-continued

EXAMPLE PRINT MATERIALS AND SOLVENTS

| Primary material | Sacrificial material | Solution |
|---|---|---|
| Nickel | | |
| Ni | Ni/Al | HCL, HNO$_3$, and acetic acids. HCL and H$_2$O$_2$ |
| Ni/Ti | Ni | Nitric and acetic acids |

System 10 can also be used to print 3D structures made of several primary material constituents, instead of a single primary metal. In such a case the composition of the sacrificial material is chosen to provide the required difference in electronegativity, wherein the sacrificial material is more anodic than all primary metals and metal alloys in the target structure. For example, the target structure can be printed from pure copper and a more cathodic copper alloy, such as Cu97%/Ag3%, while a single, common sacrificial material is chosen, more anodic than both Cu and Cu/Ag, such as Cu97%/Al3%. LIFT station 20 prints the primary and sacrificial materials in a design chosen so that electrical contact is maintained between all components. As long as the sacrificial material is more anodic than all of the primary metals, the sacrificial material will be degraded first and removed in etch station 50.

Additionally or alternatively, system 10 can be used to produce complex metal/dielectric structures, and not only metal structures. For example, by appropriate choice and use of donor films 36, LIFT station 20 can print two metal components, of which one is sacrificial, and a third, non-conductive material, which is inert in the corrosive process of etch station 50. The result will be a 3D structure made up of a metal (the primary material) and a dielectric. The target and support structures are designed so that electrical contact is maintained between the metallic parts printed by LIFT station 20.

As another option, system 10 can be used in fabricating a 3D structure made from three or more different metals, in which two distinct corrosive processes take place consecutively in etch station 50. In each etching step, a single sacrificial material is removed. For example, LIFT station 20 can produce a structure composed of metallic materials A and B (wherein B is more anodic than A) and metallic materials C and D (wherein D is more anodic than C). Each of the metal couples (A/B and C/D) has a distinct corrosive route in a chosen solvent, $S_B$ or $S_D$, which is not effective for the other couple. In this manner, etch station 50 applies solvent $S_B$ to remove material B, and then changes to $S_D$ to remove material D, leaving a complex structure composed of materials A and C.

Lift Jetting of Pure Metals and Mixtures

Figure 2:
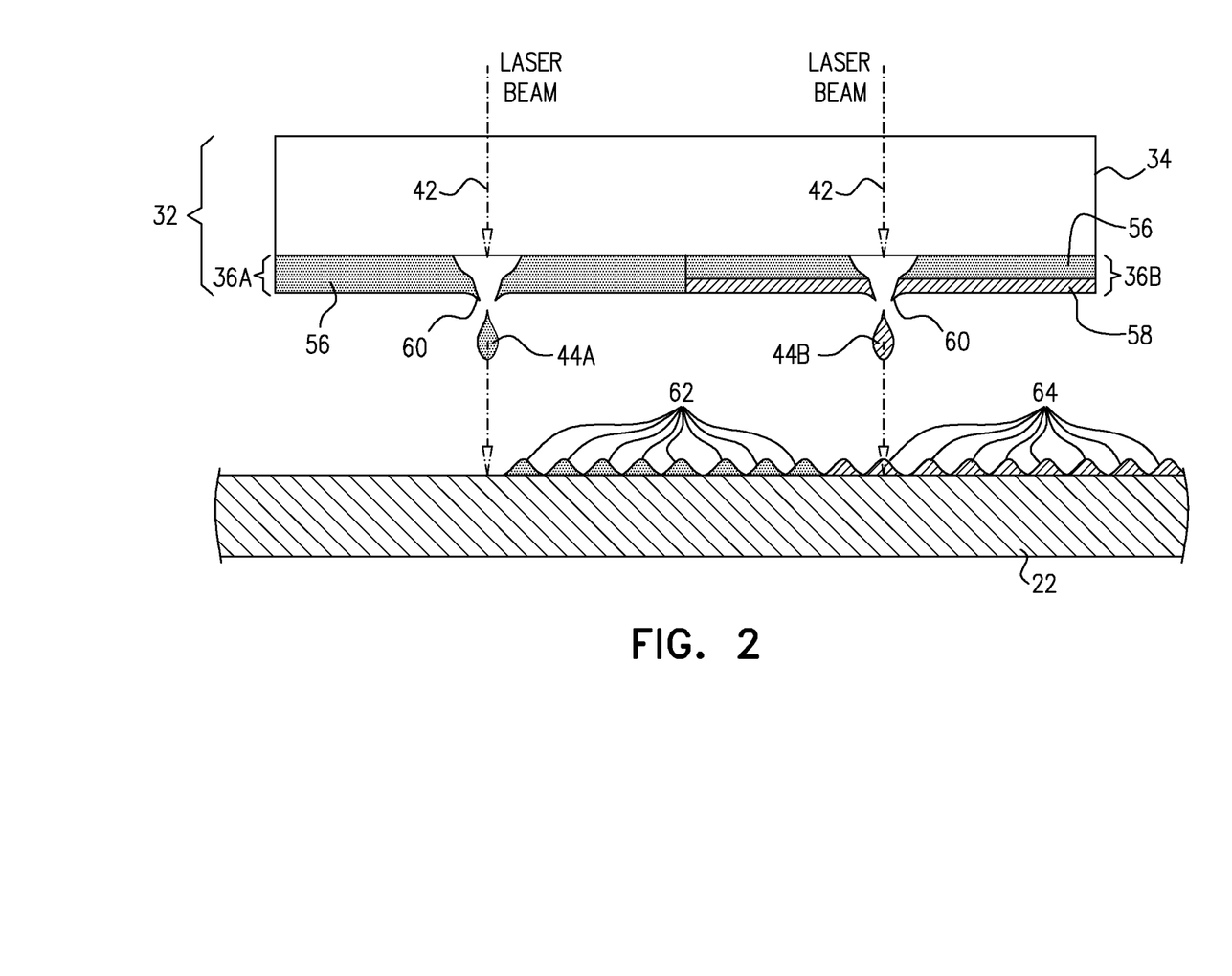
FIG. 2 is a schematic detail view showing LIFT printing of droplets having different compositions, in accordance with an embodiment of the invention.

FIG. 2 is a schematic detail view showing LIFT printing of droplets 44A and 44B, having different compositions, in accordance with an embodiment of the invention. In the pictured example, droplet 44A comprises a pure metal 56, such as copper, ejected from a donor film 36A, while droplet 44B comprises an alloy of metal 56 with another metal 58, such as aluminum or silver, ejected from another donor film 36B. Films 36A and 36B can conveniently be formed on different regions of the same donor substrate 34, thus enabling control unit 40 to shift donor sheet 32 and scan laser beam 42 in such a way that droplets 44A and 44B can be ejected and directed toward acceptor substrate 22 at the appropriate locations in rapid alternation. Alternatively, films 36A and 36B may be formed on different donor substrates, which are inserted into position in optical assembly 24 in alternation.

FIG. 2 illustrates the effect of irradiating donor films 36A and 36B with a laser pulse whose duration is comparable to the time required for heat diffusion through the films. In the case of film 36B, which comprises layers of metals 56 and 58 overlaid on donor substrate 34, the two metals are simultaneously liquefied by the laser pulses and mix within droplet 44B to form the desired alloy. The relative concentration of metals 56 and 58 in the alloy is determined by the thicknesses of the corresponding layers in film 36B. Details of this process are described in the above-mentioned PCT International Publication WO 2015/056253, and they will be summarized here only briefly. Alternatively, film 36B may comprise a pre-mixed alloy of the desired metals, such as an alloy of metals 56 and 58 in the appropriate concentrations in a single, uniform donor film. As a further alternatives, one or both of metals 56 and 58 may itself be an alloy.

Laser 26 directs beam 42, comprising a train of sub-nanosecond laser pulses, toward donor sheet 32. In an example embodiment, laser 26 emits pulses of duration 400 ps at a wavelength of 532 nm, with fluence of approximately 0.75 J/cm$^2$ at donor films 36A and 36B, whose total thickness is typically in a range between 0.3 µm and 1.5 µm. Donor substrate 34 is typically positioned so that the distance from the donor films to acceptor substrate 22 is about 0.1 mm, or possibly greater. This choice of laser pulse and film parameters gives rise to a "volcano" pattern 60 in the donor film. This "volcano-jetting" regime causes single droplets 44A/B to be emitted in response to each laser pulse, with high directionality, typically within about 5 mrad of the normal to the film surface. The sizes of the droplets can be controlled by adjusting the energy, pulse duration, and focal spot size of laser beam 42 on donor films 36A/B, as well as the thickness of the donor films. Depending on these parameter settings, the volume of droplets 44A/B can typically be adjusted within the range of 10 to 100 femtoliter.

An important consequence of the high directionality of drop ejection is that a relatively large gap can be permitted between donor sheet 32 and acceptor substrate 22 without compromising the printing accuracy. Donor substrate 34 under these conditions can readily be positioned with films 36A/B at least 0.1 mm away from the acceptor substrate, and can typically be positioned at least 0.2 mm away from the acceptor substrate or even as far as 0.5 mm away while the pulses of the laser radiation impinge on the donor film.

LIFT-driven ejection of droplets 44A/B takes place only when the laser fluence exceeds a given threshold, which depends on the donor film thickness, the laser pulse duration, and other factors. For short laser pulses (of duration 0.1-1 ns, as described above), single-droplet, "volcano-jetting" ejection will occur over a range of laser fluence values extending from the LIFT threshold up to an upper limit, which is typically about 50% greater than the threshold fluence. Above this upper fluence limit, each laser pulse will tend to induce ejection of many small droplets from the donor film, with nanoscale droplet dimensions. This latter, high-fluence regime can be useful for other purposes, but is less effective in the sort of precise 3D printing applications that are described herein.

Droplets 44A and 44B traverse the gap between donor films 36A/B and substrate 22, and then solidify rapidly as metal particles 62 and 64, respectively on the surface of the substrate. In this example, particles 62 comprise pure metal 56, while particles 64 comprise a fully-mixed alloy of metals 56 and 58. Other sorts of mixtures, such as alloys of three or more metals and mixtures of metal and non-metallic materials, can be produced in similar fashion. The diameters of particles 62 and 64 depend on the sizes of the droplets that produced them, as well as on the size of the gap traversed by the particles. Typically, in the volcano-jetting regime, particles 62 and 64 have diameters less than 5 µm, and the diameter can be reduced to less than 2 µm by appropriate setting of the LIFT parameters described above. After depositing the initial layers of particles 62 and 64 that are shown in FIG. 2, LIFT station 20 scans over the same area of acceptor substrate 22 multiple times to build up target structure 46 and support structure 48 according to the desired design and dimensions.

In the printing configuration that is shown in FIG. 2, it is desirable that the LIFT printing parameters for the sacrificial material be as close as possible, or even identical, to the conditions used for the printing of the primary material. Printing parameters of relevance in this context include pulse energy, laser spot size on donor sheet 32, laser pulse shape (temporal and spatial), and wavelength used for printing. The use of such identical, or nearly identical, parameters to irradiate both of donor films 36A and 36B is advantageous, inter alia, in permitting optical assembly 24 to switch rapidly back and forth between ejection of droplets 44A and 44B in order to efficiently print complex patterns on substrate 22. The layer structure of film 36B is beneficial in this regard, since the energy of laser beam is absorbed almost entirely in material 56, and therefore film 36B can be expected to behave in a manner almost identical, in terms of droplet ejection, to film 36A. Alternatively, some parameters of laser beam 42 can be changed fast enough to enable switching of these parameters without hampering printing performance.

Another advantage of the pictured configuration of donor films 36A and 36B is that droplets 44A and 44B, as well as the resulting particles 62 and 64, will be closely similar in thermal properties. For example, the thermal conductivities of the donor films affect the choice of best laser pulse width, while the melting temperature and heat of fusion affect the choice of pulse energy. The volumes of droplets 44A and 44B will depend on the thickness of donor films 36A and 36B and on the spatial width of beam 42, both of which depend on the thermal parameters for optimal droplet jetting. Thus, the configuration of donor layers that is shown in FIG. 2 not only makes it possible to use similar laser parameters for LIFT for both donor films, but also gives rise to droplets 44A and 44B of similar sizes and properties, and thus particles 62 and 64 of similar sizes and properties. This uniformity of particle size, as well as thermal and mechanical properties, enables support structure 48 and target structure 46 to be printed precisely and reliably, one over the other.

Example Structures

Figure 3A:
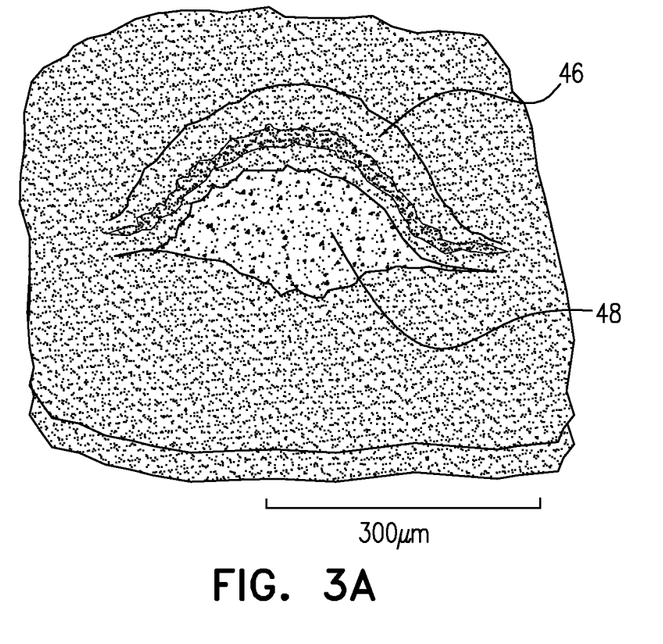
FIG. 3A is a schematic, pictorial representation of a printed 3D structure and sacrificial support, in accordance with an embodiment of the invention.
Figure 3B:
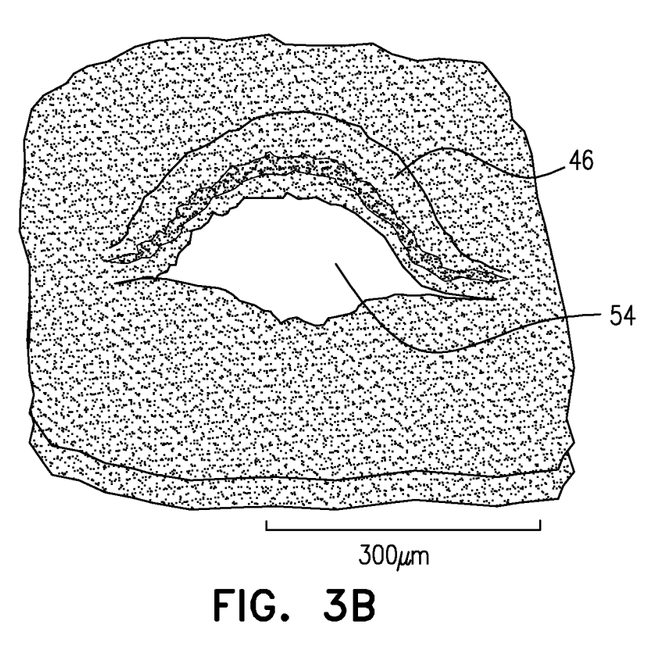
FIG. 3B is a schematic, pictorial representation of the printed 3D structure of FIG. 3A following galvanic etching of the sacrificial support, in accordance with an embodiment of the invention.

Reference is now made to FIGS. 3A and 3B, which are schematic, pictorial illustrations of target structure 46 at different stages of production, in accordance with an embodiment of the invention. These figures are based on scanning electron microscope (SEM) images of actual LIFT-printed structures, with dimensions as shown. FIG. 3A shows target structure 46 together with sacrificial support structure 48, as produced by LIFT station 20, while FIG. 3B shows target structure 46 with an internal cavity 54, following galvanic etching of the sacrificial support in etch station 50.

In this example, target structure 46, as well as the surrounding base, comprises a Cu/Ag (~98.5%/1.5%) alloy, while support structure 48 comprises pure copper. Target structure 46 has the form of a half dome, with internal radius 60 µm, which was initially printed over a hemispherical support structure 48 (FIG. 3A). This entire structure was immersed in electrolytic solvent 52, such as a ferric chloride solution, for eight minutes to dissolve the support structure and create hemispherical cavity 54, as shown in FIG. 3B.

As the galvanic corrosion process begins, support structure 48 typically starts to degrade, from its solid phase to an ionic soluble form. The degradation occurs at the interface between the sacrificial and primary materials, where there is electrical contact between the materials. After some time, a bulk part of the support structure can be fully isolated, whereupon it is detached from the surrounding walls of the target structure, and the galvanic etching process stops. For this purpose, it is generally necessary to leave at least a small exit hole in the target structure, to allow solution to flow in and out so that etching can proceed.

Figure 4A:
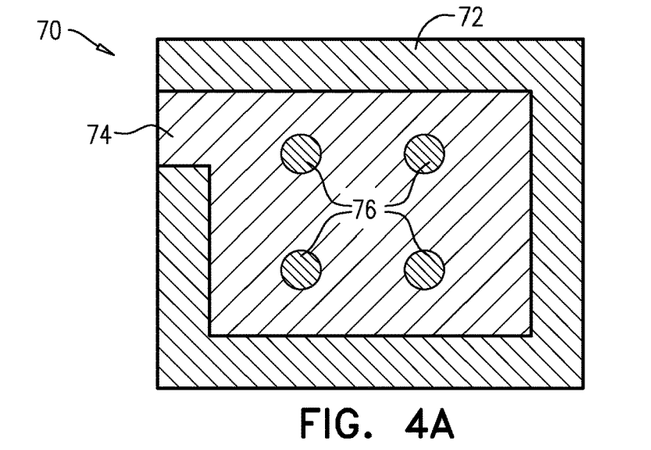
FIG. 4A is a schematic sectional view of a printed 3D structure containing a cavity filled with an anodic sacrificial support and cathodic etch-assist structures in the cavity, in accordance with an embodiment of the invention.
Figure 4B:
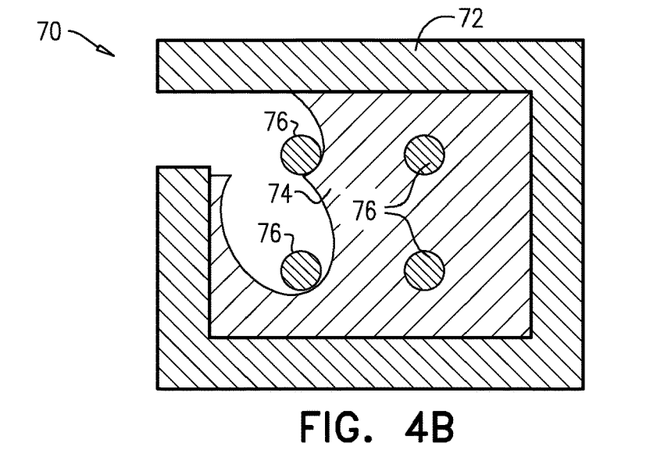
FIG. 4B is a schematic sectional view of the printed 3D structure of FIG. 4A during the process of galvanic etching of the sacrificial support, in accordance with an embodiment of the invention.
Figure 4C:
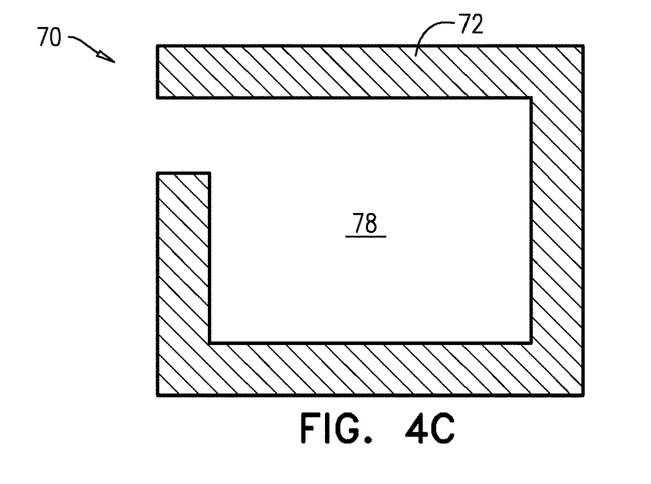
FIG. 4C is a schematic sectional view of the printed 3D structure of FIG. 4A following completion of the galvanic etching and removal of the etch-assist structures, in accordance with an embodiment of the invention.

FIGS. 4A-4C are schematic sectional views of a printed 3D structure 70, illustrating successive stages in a technique for fabrication of a target structure 72, in accordance with an embodiment of the invention. As shown in FIG. 4A, in LIFT station 20, the primary metallic material in target structure 72 is printed over a sacrificial material 74 so that the resulting target structure has a cavity containing the sacrificial material. Structure 70 is then inserted into etching station 50 in order to remove sacrificial material 74 by galvanic corrosion, leaving cavity 78 open within target structure 72, as shown in FIG. 4C.

In the case of a deep cavity, however, the galvanic process may stall before all of the sacrificial material has been dissolved, due to lack of adequate electrical conduction between the remaining sacrificial material and the primary material outside the cavity.

One way to overcome this problem is to print, in LIFT station 20, additional etch-assist structures 76, embedded within sacrificial material 74 in the cavity, as shown in FIG. 4A. Etch-assist structures 76 can printed from the same primary material as target structure 72 or from another suitable metallic material that is less anodic than sacrificial material 74. Etch-assist structures 76 promote galvanic corrosion of sacrificial material 74, as illustrated in FIG. 4B, since once they are exposed to the solvent, they provide additional electrical contact areas with the sacrificial material. When all of sacrificial material 74 in cavity 78 has been etched out of the cavity, etch-assist structures 76 are removed as well, as shown in FIG. 4C. For example, etch-assist structures 76 may be printed in such a way as to come loose and wash out of cavity 78 when the surrounding sacrificial material has dissolved, or the etch-assist structures may be etched out chemically.

Figure 5A:
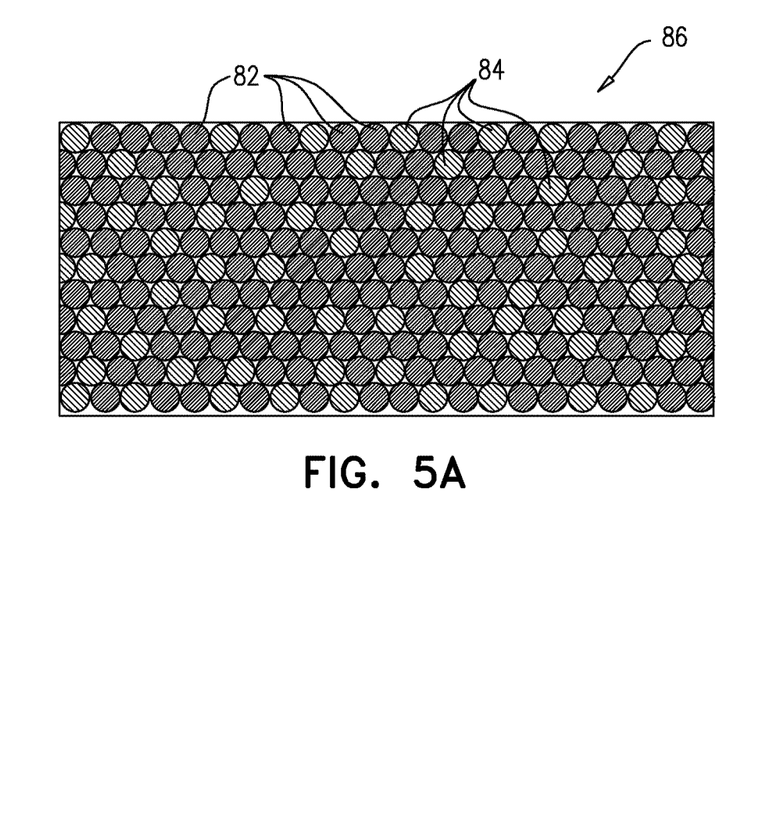
FIG. 5A is a schematic sectional view of a printed 3D structure in which droplets of a cathodic material are interspersed with droplets of an anodic sacrificial material, in accordance with an embodiment of the invention.
Figure 5B:
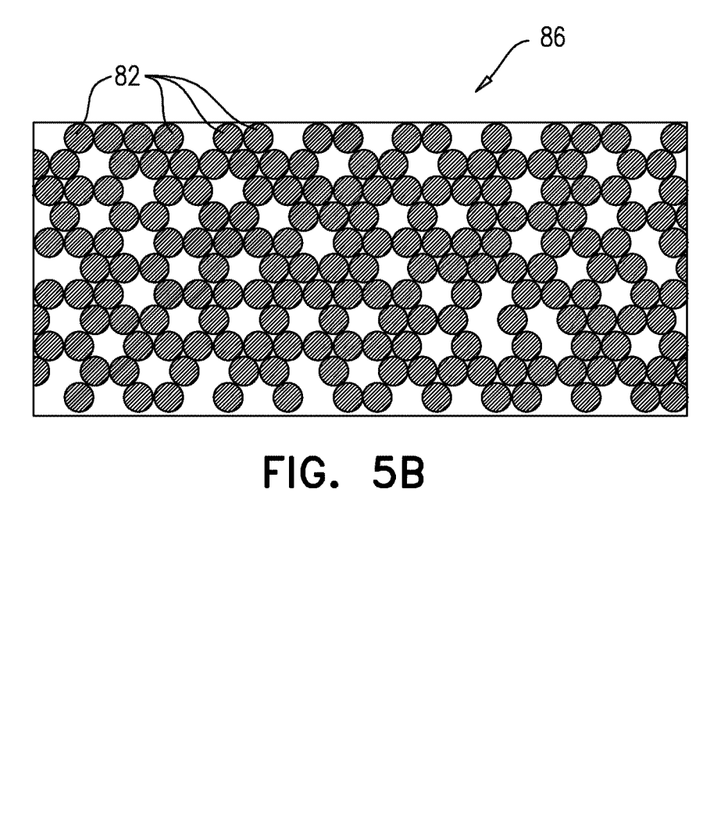
FIG. 5B is a schematic sectional view of a porous 3D structure created by galvanic etching of the anodic sacrificial material from the structure of FIG. 5A, in accordance with an embodiment of the invention.

FIGS. 5A and 5B are schematic sectional views of a printed 3D structure 86, illustrating successive stages in a technique for fabrication of a porous target structure, in accordance with an embodiment of the invention. As shown in FIG. 5A, LIFT station 20 initially creates structure 86 by printing particles 82 of a cathodic primary material, interspersed with particles 84 of an anodic sacrificial material. Etching station 50 then etches away particles 84 by galvanic corrosion, so that the target structure remaining after removal of the "support structure" provided by particles 84 is porous, as shown in FIG. 5B.

The process illustrated in FIGS. 5A/B can be applied, for example, in producing aluminum foams, which have unique mechanical properties. For this purpose, particles 84 (and the droplets used to create them) can comprise pure aluminum, while particles 82 comprise an aluminum alloy, with a small amount of another metal to make it more cathodic (such as Al98%/Cu2%). Etching station 50 then selectively removes the aluminum, leaving an Al/Cu foam. This technique can be used to make soft materials (small Young modulus), which are nonetheless highly stable, as they comprise metals rather than organic compounds.

Very fine pores can be produced in this manner, with dimensions on the order of the droplet dimensions (less than 5 μm). Furthermore, the porosity can be adjusted simply by adjusting the relative printing densities of particles 82 and 84.

Structures with graded porosity—i.e., porosity that varies over the area of the target structure—can be produced by varying the relative density of the particles 84 over the area of the target structure. It is thus possible to make 3D structures with graded softness and strength, as well as structures with non-isotropic mechanical properties, for example, different elongation properties along different directions. This technique can be used, inter alia, to produce porous titanium for biomedical applications.

It will be appreciated that the embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

The invention claimed is:

1. A method for 3D printing, comprising:
   printing a first metallic material on a substrate as a support structure;
   printing a second metallic material, which is less anodic than the first metallic material, on the substrate as a target structure, in contact with the support structure; and
   chemically removing the support structure from the target structure by applying a galvanic effect to selectively corrode the first metallic material by placing the first and second metallic materials in an electrolyte, which causes a current to flow between the first and second metallic materials without application of an external driving potential to the metallic materials.

2. The method according to claim 1, wherein one of the first and second materials comprises a pure metal, and the other of the first and second materials comprises an alloy of the pure metal.

3. The method according to claim 2, wherein the pure metal makes up at least 90% of the alloy.

4. The method according to claim 2, wherein the first material is the pure metal, and the second material is the alloy.

5. The method according to claim 2, wherein the second material is the pure metal, and the first material is the alloy.

6. The method according to claim 2, wherein the first and second materials are different alloys of the pure metal.

7. The method according to claim 1, wherein printing the first and second metallic materials comprises directing pulses of laser radiation onto first and second thin films, respectively, so as to induce laser-induced forward transfer (LIFT) of molten droplets of the first and second materials onto the substrate.

8. The method according to claim 7, wherein at least one of the first and second metallic materials comprises a mixture of at least two component materials, and wherein directing the pulses of laser radiation comprises:
   providing a transparent donor substrate on which multiple thin film layers are overlaid, comprising respective layers of each of the component materials; and
   irradiating the donor substrate with the pulses of laser radiation in order to induce ejection of molten droplets in which the component materials are mixed together.

9. The method according to claim 1, and comprising printing a third material over at least one of the first and second metallic materials, whereby the target structure comprises, after removing the support structure, the second metallic material and the third material.

10. The method according to claim 9, wherein the third material comprises a dielectric material.

11. The method according to claim 1, wherein the second metallic material is printed over the first metallic material so that the target structure has a cavity containing the first metallic material, and wherein chemically removing the support structure comprises etching the first metallic material out of the cavity by the galvanic effect.

12. The method according to claim 1, wherein printing the first and second metallic materials comprises printing interspersed particles of the first and second metallic materials, and wherein chemically removing the support structure comprises etching away the particles of the first metallic material by the galvanic effect so that the target structure remaining after removal of the support structure is porous.

13. A method for 3D printing, comprising:
   printing a first metallic material on a substrate as a support structure;
   printing a second metallic material, which is less anodic than the first metallic material, on the substrate as a target structure, in contact with the support structure; and
   chemically removing the support structure from the target structure by applying a galvanic effect to selectively corrode the first metallic material,
   wherein the second metallic material is printed over the first metallic material so that the target structure has a cavity containing the first metallic material, and wherein chemically removing the support structure comprises etching the first metallic material out of the cavity by the galvanic effect, and
   wherein the method comprises printing cathodic etch-assist structures, which are less anodic than the first metallic material, embedded within the first metallic material in the cavity so as to promote the galvanic effect during the etching, and wherein the method comprises removing the etch-assist structures from the cavity after etching out the first metallic material.

14. A method for 3D printing, comprising:
   printing a first metallic material on a substrate as a support structure;
   printing a second metallic material, which is less anodic than the first metallic material, on the substrate as a target structure, in contact with the support structure; and
   chemically removing the support structure from the target structure by applying a galvanic effect to selectively corrode the first metallic material,
   wherein printing the first and second metallic materials comprises printing interspersed particles of the first and second metallic materials, and wherein chemically removing the support structure comprises etching away the particles of the first metallic material by the galvanic effect so that the target structure remaining after removal of the support structure is porous, and wherein printing the interspersed particles comprises varying a relative density of the particles of the first metallic material over an area of the target structure, so that the second metallic material remaining after removal of the support structure has a porosity that varies over the area of the target structure.

15. Fabrication apparatus, comprising:

a printing station, which is configured to print a first metallic material on a substrate as a support structure, and to print a second metallic material, which is less anodic than the first metallic material, on the substrate as a target structure, in contact with the support structure; and an etching station, which is configured to chemically remove the support structure from the target structure by applying a galvanic effect to selectively corrode the first metallic material by placing the first and second metallic materials in an electrolyte, which causes a current to flow between the first and second metallic materials without application of an external driving potential to the metallic materials.

16. The apparatus according to claim 15, wherein one of the first and second materials comprises a pure metal, and the other of the first and second materials comprises an alloy of the pure metal.

17. The apparatus according to claim 15, wherein the pure metal makes up at least 90% of the alloy.

18. The apparatus according to claim 15, wherein the first material is the pure metal, and the second material is the alloy.

19. The apparatus according to claim 15, wherein the second material is the pure metal, and the first material is the alloy.

20. The apparatus according to claim 15, wherein the first and second materials are different alloys of the pure metal.

21. The apparatus according to claim 15, wherein the printing station is configured to print the first and second metallic materials by directing pulses of laser radiation onto first and second thin films, respectively, so as to induce laser-induced forward transfer (LIFT) of molten droplets of the first and second materials onto the substrate.

22. The apparatus according to claim 21, wherein at least one of the first and second metallic materials comprises a mixture of at least two component materials, and wherein the printing station comprises a transparent donor substrate on which multiple thin film layers are overlaid, comprising respective layers of each of the component materials and is configured to irradiate the donor substrate with the pulses of laser radiation in order to induce ejection of molten droplets in which the component materials are mixed together.

23. The apparatus according to claim 15, wherein the printing station is configured to print a third material over at least one of the first and second metallic materials, whereby the target structure comprises, after removing the support structure, the second metallic material and the third material.

24. The apparatus according to claim 23, wherein the third material comprises a dielectric material.

25. The apparatus according to claim 15, wherein the printing station is configured to print the second metallic material over the first metallic material so that the target structure has a cavity containing the first metallic material, and wherein the etching station is configured to etch the first metallic material out of the cavity by the galvanic effect.

26. The apparatus according to claim 25, wherein the printing station is configured to print etch-assist structures, which are less anodic than the first metallic material, embedded within the first metallic material in the cavity so as to promote the galvanic effect during the etching, wherein the etch-assist structures are removed from the cavity after etching out the first metallic material.

27. The apparatus according to claim 15, wherein the printing station is configured to print interspersed particles of the first and second metallic materials, and wherein the etching station is configured to etch away the particles of the first metallic material by the galvanic effect so that the target structure remaining after removal of the support structure is porous.

28. The apparatus according to claim 27, wherein the printing station is configured to vary a relative density of the particles of the first metallic material over an area of the target structure, so that the second metallic material remaining after removal of the support structure has a porosity that varies over the area of the target structure.

* * * * *